United States Patent
Baggett et al.

(10) Patent No.: US 10,861,731 B2
(45) Date of Patent: Dec. 8, 2020

(54) RADIANT HEATING PRESOAK

(71) Applicant: Axcelis Technologies, Inc., Beverly, MA (US)

(72) Inventors: John F. Baggett, Amesbury, MA (US); Billy Benoit, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 286 days.

(21) Appl. No.: 15/872,543

(22) Filed: Jan. 16, 2018

(65) Prior Publication Data

US 2018/0204755 A1 Jul. 19, 2018

Related U.S. Application Data

(60) Provisional application No. 62/448,324, filed on Jan. 19, 2017.

(51) Int. Cl.
| | |
|---|---|
| *H01L 21/683* | (2006.01) |
| *H01L 21/687* | (2006.01) |
| *H01L 21/265* | (2006.01) |
| *H01L 21/67* | (2006.01) |
| *H01L 21/677* | (2006.01) |
| *H01J 37/32* | (2006.01) |

(52) U.S. Cl.
CPC .... *H01L 21/6833* (2013.01); *H01J 37/32412* (2013.01); *H01J 37/32724* (2013.01); *H01L 21/265* (2013.01); *H01L 21/67115* (2013.01); *H01L 21/67213* (2013.01); *H01L 21/67248* (2013.01); *H01L 21/67739* (2013.01); *H01L 21/687* (2013.01); *H01L 21/6831* (2013.01); *H01L 21/68728* (2013.01)

(58) Field of Classification Search
None
See application file for complete search history.

(56) References Cited

U.S. PATENT DOCUMENTS

| | | |
|---|---|---|
| 7,485,190 B2 | 2/2009 | Cox |
| 8,194,384 B2 | 6/2012 | Nasman et al. |
| (Continued) | | |

OTHER PUBLICATIONS

International Search Report dated Jun. 7, 2018 in connection with International Application No. PCT/US2018/014132.

*Primary Examiner* — Angel Roman
(74) *Attorney, Agent, or Firm* — Eschweiler & Potashnik, LLC

(57) ABSTRACT

A workpiece processing system and method comprises transferring a workpiece to a vacuum chamber. A heated chuck is configured to selectively clamp a workpiece to a clamping surface thereof, wherein the heated chuck is configured to selectively heat the clamping surface. A workpiece transfer apparatus has an end effector configured to transfer the workpiece to the heated chuck, wherein the workpiece rests on the end effector. A controller selectively position the workpiece with respect to the heated chuck via a control of the workpiece transfer apparatus, wherein the controller is configured to position the workpiece at a predetermined distance from the clamping surface, wherein the predetermined distance generally determines an amount of radiation received by the workpiece from the heated chuck, and wherein the controller is further configured to place the workpiece on the surface of the heated chuck via a control of the workpiece transfer apparatus.

7 Claims, 3 Drawing Sheets

(56) References Cited

U.S. PATENT DOCUMENTS

| | | |
|---|---|---|
| 8,941,968 B2 | 1/2015 | Justesen et al. |
| 9,378,992 B2 | 6/2016 | Huseinovic et al. |
| 2004/0137397 A1* | 7/2004 | Cox .................. H01L 21/67103 432/253 |
| 2015/0380285 A1 | 12/2015 | Huseinovic |

* cited by examiner

RADIANT HEATING PRESOAK

REFERENCE TO RELATED APPLICATIONS

This application claims the benefit of U.S. Provisional Application No. 62/448,324 filed Jan. 19, 2017, entitled "RADIANT HEATING PRESOAK", the contents of which are herein incorporated by reference in their entirety.

FIELD

The present disclosure relates generally to workpiece processing systems and methods for processing workpieces, and more specifically to a system and method for controlling a temperature of a workpiece prior to being placed on a heated chuck.

BACKGROUND

In semiconductor processing, many operations, such as ion implantation, may be performed on a workpiece or semiconductor wafer. As ion implantation processing technology advances, a variety of ion implantation temperatures at the workpiece can be implemented to achieve various implantation characteristics in the workpiece. For example, in conventional ion implantation processing, three temperature regimes are typically considered: cold implants, where process temperatures at the workpiece are maintained at temperatures below room temperature, hot implants, where process temperatures at the workpiece are maintained at high temperatures typically ranging from 300-600° C., and so-called quasi-room temperature implants, where process temperatures at the workpiece are maintained at temperatures slightly elevated above room temperature, but lower than those used in high temperature implants, with quasi-room temperature implant temperatures typically ranging from 50-100° C.

Hot implants, for example, are becoming more common, whereby the process temperature is typically achieved via a heated chuck, where the workpiece is generally fixed to a clamping surface of the heated chuck during implantation by electrostatic force or mechanical clamping. For example, a heated electrostatic chuck (ESC) holds or clamps the workpiece using electrostatic force, while mechanical clamping mechanically maintains a position of the workpiece relative to the heated chuck by mechanical means. A conventional high temperature ESC, for example, comprises a set of heaters embedded under the clamping surface for heating the ESC and workpiece to the process temperature (e.g., 300° C.-600° C.), whereby a gas interface conventionally provides a thermal interface from the clamping surface to the backside of the workpiece.

Placement of a relatively cool workpiece on a surface of the heated chuck, however, can lead to various problems when the workpiece thermally expands or grows with respect to the clamping surface due to the increase in temperature. Such expansion can lead to warpage or cracking of the workpiece, and such expansion is particularly problematic when the workpiece comprises silicon carbide. Further, when the cool workpiece is placed on the surface of the heated chuck, a substantially steep rate of heating is induced in the workpiece, whereby thermal non-uniformities may be induced across the workpiece, thus further leading to problems such as thermal stress and breakage of the workpiece.

SUMMARY OF THE INVENTION

The present invention overcomes the limitations of the prior art by providing a system, apparatus, and method for transferring workpieces between atmospheric and vacuum environments of high temperature ion implantation systems, while maximizing throughput and minimizing costs of ownership associated with the systems.

Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a workpiece processing system, such as an ion implantation system. In accordance with one exemplary aspect, the workpiece processing system comprises a vacuum chamber and a first chamber operably coupled to the vacuum chamber. A heated chuck, for example, is positioned within the process chamber, wherein the heated chuck is configured to selectively clamp a workpiece to a clamping surface thereof. The heated chuck, for example, is further configured to selectively heat the clamping surface of the heated chuck.

According to one example, a workpiece transfer apparatus is further provided having an end effector configured to selectively support the workpiece. The workpiece, for example, may rest on the end effector, whereby the end effector restrains the workpiece in only one degree of freedom. The workpiece transfer apparatus, for example, is configured to selectively transfer the workpiece between the heated chuck and the first chamber, and various positions in between.

A controller, for example, is further provided and configured to selectively position the workpiece with respect to the heated chuck via a control of the workpiece transfer apparatus. The controller, for example, is configured to position the workpiece at a predetermined distance from the clamping surface, wherein the predetermined distance generally determines an amount of radiation that is received by the workpiece from the heated chuck, thereby permitting selective heating of the workpiece by thermal radiation. The heated chuck, for example, can comprise one or more radiative heaters embedded within, or otherwise associated with, the heated chuck. The controller, for example, is further configured to selectively place the workpiece on the surface of the heated chuck via a control of the workpiece transfer apparatus.

In one example, the controller is further configured to control an amount of time during which the workpiece is positioned at the predetermined position. In another example, the controller is configured to selectively vary one or more of the predetermined distance and amount of time based on one or more of a desired temperature profile of the workpiece and a predetermined temperature profile of the heated chuck.

The heated chuck, for example, is further configured to heat the workpiece to a predetermined processing temperature. The predetermined processing temperature, for example, can range from approximately 100° C. to approximately 1200° C.

In accordance with another aspect of the disclosure, a method is provided for preheating a workpiece in an ion implantation system. The method, for example, comprises transporting the workpiece from a first location at a first temperature to a predetermined position proximate to a surface of a heated chuck within a chamber. The predetermined position, for example, comprises a position located a predetermined distance from the surface of the heated chuck.

Thermal radiation, for example, is emitted from the heated chuck, whereby the workpiece is exposed to the thermal radiation from heated chuck at the predetermined position. The workpiece, for example, is maintained at the predetermined position for a predetermined period of time, thereby increasing the temperature of the workpiece to a second temperature.

In one example, the first temperature is less than approximately 100° C. and the second temperature is greater than approximately 300° C. In another example, the first temperature is approximately in the range of 20° C. to 100° C., and the second temperature is approximately in the range of 300° C. to 600°

In another example, the workpiece is further placed on the surface of the heated chuck after being heated to the second temperature, and ions can be further implanted into the workpiece. For example, the workpiece can be electrostatically clamped to the surface of the heated chuck. Alternatively, the workpiece can be mechanically clamped to the surface of the heated chuck via one or more mechanical clamps.

In one example, transporting the workpiece from the first location to the predetermined position proximate to the surface of the heated chuck further comprises transferring the workpiece from a first environment to a vacuum environment within the chamber.

In yet another example, the predetermined distance is determined based on one or more radiative properties of the heated chuck. For example, the heated chuck can have a variable radiative profile across the surface thereof, wherein determining the predetermined distance comprises determining a view factor between the workpiece and the surface of the heated chuck.

In accordance with another exemplary aspect of the disclosure, another method is provided for preheating a workpiece in an ion implantation system, where the workpiece is transported from a first location at a first temperature to a predetermined position located a predetermined distance from a surface of a heated chuck within a chamber. Thermal radiation is emitted from the heated chuck, whereby the workpiece is exposed to the thermal radiation from heated chuck at the predetermined position. The workpiece is maintained at the predetermined position for a predetermined period of time, thereby increasing the temperature of the workpiece to a second temperature. Once the second temperature is reached, the workpiece is placed on the surface of the heated chuck and selectively clamped thereto, such as by electrostatic or mechanical clamping forces, wherein ions can be further implanted into the workpiece.

In one example, one or more of the predetermined distance and amount of time are further varied based on one or more of a desired temperature profile of the workpiece and a predetermined temperature profile of the heated chuck. In yet another example, heating the workpiece to the first temperature is performed in a load lock chamber.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
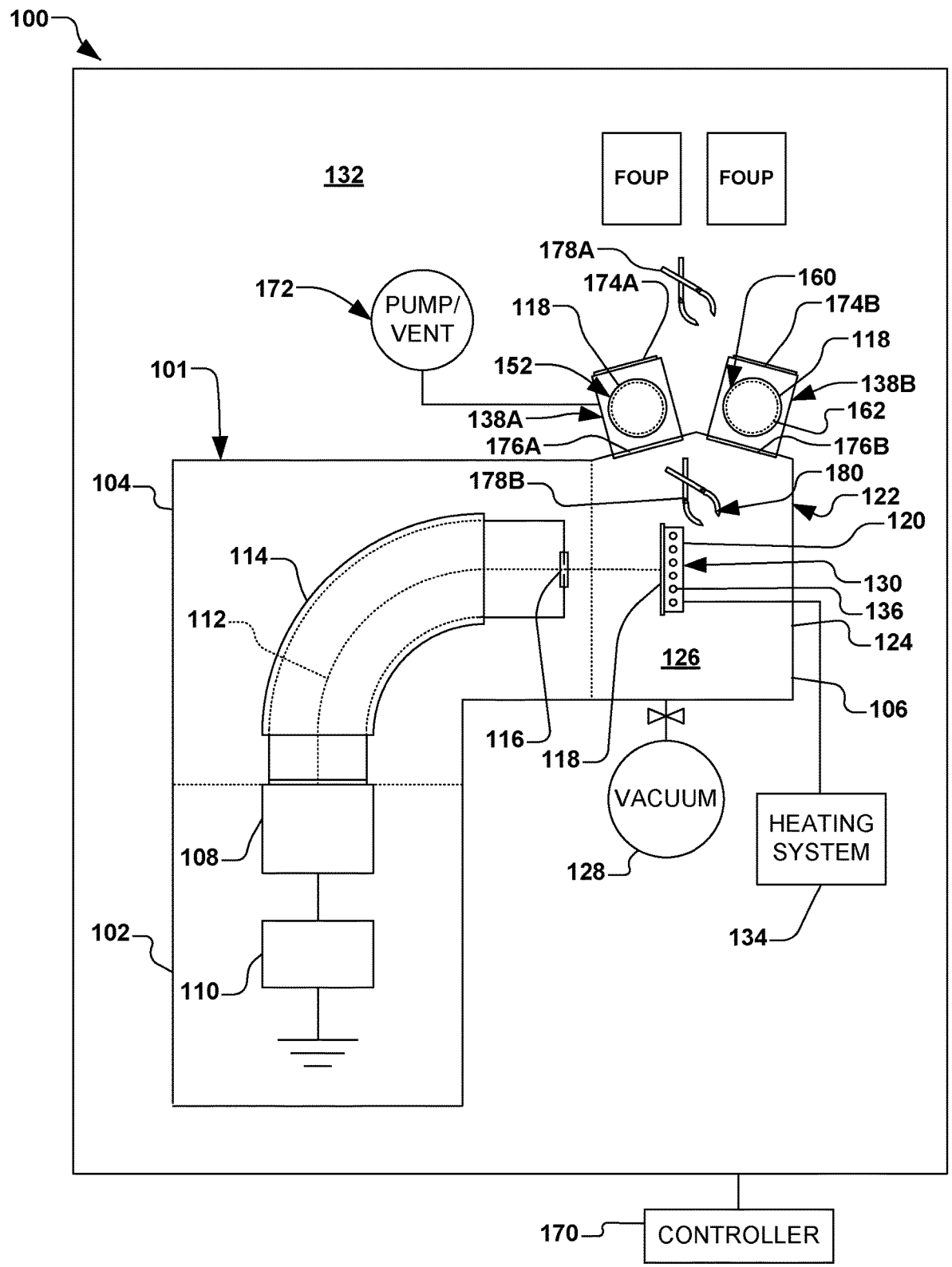
FIG. 1 illustrates a block diagram of an exemplary heated ion implantation system in accordance with one aspect of the present disclosure.

The present disclosure is directed generally toward systems having a heated chuck configured to receive a relatively cool workpiece. In one embodiment, the present disclosure relates to ion implantation systems, and more particularly, to an ion implantation system configured for hot ion implantation (e.g., 300° C.-600° C.). However, it should be understood that the present disclosure is applicable to various other systems where a relatively cool workpiece is placed on a relatively hot surface.

Accordingly, the present disclosure will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details.

In accordance with one aspect of the present disclosure, FIG. 1 illustrates an exemplary ion implantation system 100. The ion implantation system 100 in the present example comprises an exemplary ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In an exemplary ion implantation utilizing the exemplary ion implantation system 101 (e.g., a Purion M or Purion H ion implantation system manufactured by Axcelis Technologies of Beverly, Mass.), a workpiece 118 having a diameter of 300 mm is exposed to the ion beam 112.

In one example, the ion implantation apparatus 101 is configured to provide a high temperature ion implantation, wherein the workpiece 118 is heated to a process temperature (e.g., approximately 300-600° C.) on the chuck 120. Thus, in the present example, the chuck 120 comprises a heated chuck 130, wherein the heated chuck is configured to support and retain the workpiece 118 while further heating the workpiece 118 within the process chamber 122 prior to, during, and/or after the exposure of the workpiece to the ion beam 112.

The heated chuck 130 of the present example comprises an electrostatic chuck (ESC) configured to heat the workpiece 118 to a processing temperature that is considerably greater than an ambient or atmospheric temperature of the surroundings or external environment 132 (e.g., also called an "atmospheric environment"). It should be noted, however, that the heated chuck 130 may alternatively comprise a chuck having mechanical clamps (not shown) for selectively securing the workpiece 118 thereto.

A heating system 134 may be further provided, wherein the heating system is configured to heat the heated chuck 130 and, in turn, the workpiece 118 residing thereon to the desired processing temperature. The heating system 134, for example, is configured to selectively heat the workpiece 118 via one or more heaters 136 disposed within the heated chuck 130.

For some high temperature implants, the workpiece 118 is allowed to "soak" on the heated chuck 130 within the vacuum of the process environment 126 until the desired temperature is reached. Alternatively, in order to increase cycle time through the ion implantation system 100 the workpiece may be pre-heated in one or more chambers 138A, 138B (e.g., one or more load lock chambers) operatively coupled to the process chamber 122 via a pre-heat apparatus 152.

Depending on the tool architecture, process, and desired throughput, the workpiece 118 may be preheated to the first temperature via the pre-heat apparatus 152, wherein the first temperature is equal to or lower than the process temperature, thus allowing for a final thermal equalization at the heated chuck 130 inside the vacuum chamber 124. Such a scenario allows the workpiece 118 to lose some heat during transfer to the process chamber 122, wherein final heating to the process temperature is performed at the heated chuck 130.

The pre-heat apparatus 152 associated with the one or more chambers (e.g., illustrated in chamber 138A in FIG. 1) can heat the workpiece 118 at the atmospheric pressure of the external environment 132 prior to bringing the workpiece to the vacuum of the process environment 126 of the process chamber 120. In some instances, the workpiece 118 may be heated from an initial temperature (e.g., room temperature) to a first predetermined temperature on the pre-heat apparatus 152.

In order to transfer attain heat transfer during processing, the back side of the workpiece 118 is brought into conductive communication with the heated chuck 130. This conductive communication is achieved through a pressure controlled gas interface (also called "back side gas") between the heated chuck 130 and the workpiece 118. Pressure of the back side gas, for example, is generally limited by the electrostatic force of the heated chuck 130, and can be generally kept in the range of 5-20 Torr. In one example, the back side gas interface thickness (e.g., the distance between the workpiece 118 and the heated chuck 130) is controlled on the order of microns (typically 5-20 μm), and as such, the molecular mean free path in this pressure regime becomes large enough for the interface thickness to push the system into the transitional and molecular gas regime.

The present disclosure contemplates utilizing the system 100 for a so-called "high temperature implant", whereby the heated chuck 130 is heated to a high implant temperature of approximately 300-600° C., as well as quasi-room temperature implants at temperatures between 20-100° C. In a high temperature implant, the workpiece 118 may be further pre-heated to approximately the high implant temperature prior to being placed on the heated chuck 130, whereby the preheated workpiece 118 is loaded onto the heated chuck and the high temperature implant is performed. Thus, the present disclosure provides a system and method for utilizing the same heated chuck 130 to perform quasi-room temperature implants, as well as high temperature implants, thus providing versatility not previously seen conventional systems.

In accordance with another exemplary aspect, a controller 170 is further provided and configured to selectively activate the heating system 134, the pre-heat apparatus 152, and the cooling apparatus to selectively heat or cool the workpiece 118 respectively residing thereon. The controller 170, for example, may be configured to heat the workpiece 118 in chamber 138A via the pre-heat apparatus 152, to heat the workpiece to a predetermined temperature in the processing chamber 122 via the heated chuck 130 and heating system 134, to implant ions into the workpiece via the ion implantation apparatus 101, to cool the workpiece in chamber 138B via the cooling apparatus 160, and to selectively transfer the workpiece between the atmospheric environment 132 and the vacuum environment 126 via control of a pump and vent 172, the respective atmospheric doors 174A, 174B and vacuum doors 176A, 176B of the respective chambers 138A, 138B, and workpiece transfer apparatus 178A, 178B (e.g., a robot with an end effector 180 configured to support the workpiece).

Prior to being placed on the heated chuck 130, but after the workpiece 118 is brought within the vacuum chamber 124, the workpiece 118 is generally maintained in a high vacuum environment, whereby heat transfer is largely dominated by radiation.

As will now be discussed in accordance with several aspects of the present disclosure, the workpiece 118 can be advantageously positioned a predetermined distance from the surface of the heated chuck 130 by the workpiece transfer apparatus 178B when the workpiece is at an initial temperature (e.g., about 20° C. or approximately room temperature), and the temperature of the workpiece is allowed to rise due to thermal radiation emitted from the heated chuck. By allowing the temperature of the workpiece 118 to rise via thermal radiation emitted from the heated chuck 130, the present disclosure thus provides a relatively uniform temperature across the workpiece by diffusing the radiated heat across the predetermined distance between the workpiece and the surface of the heated chuck.

In order to gain a better understanding of the disclosure, it should be first understood that various deleterious issues may exist when a relatively cold workpiece 118 (e.g., at room temperature or approximately 20 C) is placed on, and clamped to, the heated chuck 130 when the heated chuck is at a substantially high temperature (e.g., 1000 C). For example, such a placement of a workpiece 118 (e.g., at room temperature) onto the heated chuck 130 (e.g., at a substantially higher temperature) can induce thermal stresses in the workpiece that can lead to warpage, "potato chipping", cracking of the workpiece, or other damage to the workpiece when the workpiece is clamped to the heated chuck.

If the workpiece 118 is quickly clamped on the heated chuck 130, for example, the workpiece generally cannot thermally expand. Such a limit in expansion, for example, can lead to stresses and breakage, thermal non-uniformities across the workpiece 118, as well as various other issues associated with the thermal stress being a "shock" to the workpiece.

Figure 2:
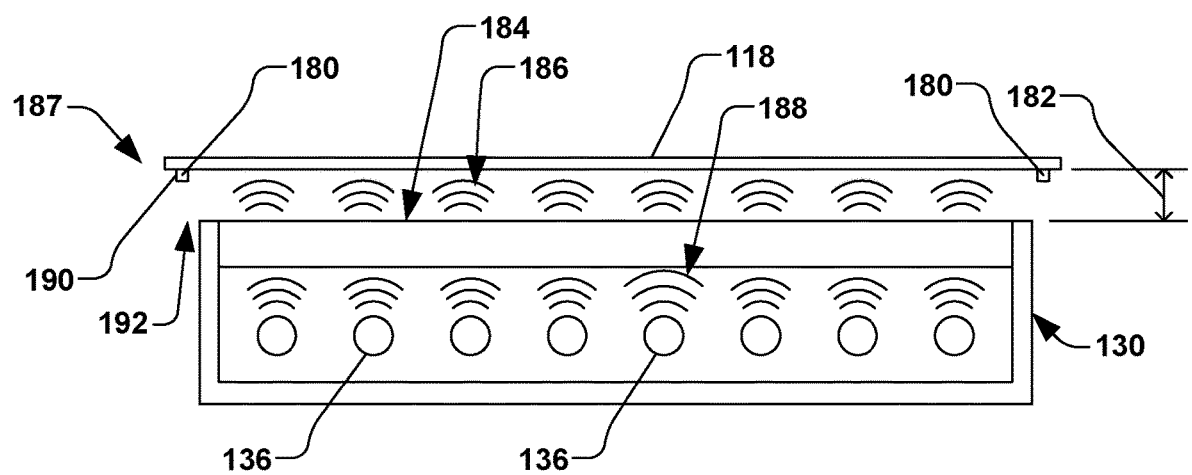
FIG. 2 is a block diagram illustrating an exemplary apparatus for heating a workpiece according to another exemplary aspect of the disclosure.

The present disclosure differs from conventional systems, however, as the present disclosure advantageously utilizes the heated chuck 130 (e.g., a mechanical or electrostatic clamping chuck) as source of preheating of the workpiece 118, prior to any placement of the workpiece onto its surface. In accordance with one aspect, the end effector 180 of the workpiece transfer apparatus 178B, for example, is advantageously configured to support the workpiece a predetermined distance 182 (e.g., approximately 10 mm) above a surface 184 of the heated chuck 130, as illustrated in FIG. 2. The predetermined distance 182 between the workpiece 118 and the surface 184 of the heated chuck 130, for example, can be varied in order to change a rate of preheating, a rate of thermal absorption, and the associated heat transfer between the heated chuck and the workpiece via radiation 186 emitted from the one or more heaters 136 of the heated chuck. Accordingly, radiation heat transfer from the heated chuck 130 is configured to heat the workpiece 118, whereby the workpiece is permitted to grow or expand thermally while resting on the end effector 180 based on its coefficient of thermal expansion (CTE).

Conventionally, a workpiece is placed directly on a surface of a heated chuck, whereby thermal expansion of the workpiece is accommodated by a grip and release sequence. For example, the conventional workpiece is placed on and clamped to the surface of the chuck, and the workpiece is heated by the chuck. In order to permit the workpiece to expand, the heated chuck releases the clamping of the workpiece, then again clamps the workpiece onto the heated chuck after said expansion. Such a cycle of clamping and releasing is repeated until the desired temperature is reached, and can be not only time consuming, but can also lead to particle contamination. For example, if the workpiece is not completely flat, clamping of the workpiece to the chuck may be difficult, or the workpiece can be broken or otherwise cause contamination particles concurrent with such clamp and release cycles.

Thus, in accordance with the present disclosure, by radiatively preheating the workpiece 118 at the predetermined distance 182 above the surface 184 of the heated chuck 130, as illustrated in FIG. 2, better uniformity of the heating across the workpiece 118 can be attained due to a view factor between the workpiece and surface of the heated chuck being further away from the heat source (e.g., the heated chuck). In general, radiative heat transfer is driven by the temperature difference between a heat source and the object being heated, as well as the view that the object has to the source, known as the view factor. Such a view factor, for example, ranges from zero to one. If the workpiece 118 is behind or otherwise blocked from the heat source, for example, the view factor would be a zero. If the workpiece 118 is resting on the surface 184 of the heated chuck 130 (the source), for example, the view factor is one (e.g., 1:1), as all the heat from the source is transferred to workpiece. If the workpiece 118 is positioned the predetermined distance 182 (e.g., 10 mm) away from the heated chuck 130, some heat will be transferred to the workpiece, while some heat will be radiated to the sides 187, and thus not be transferred to the workpiece. For example, if the predetermined distance 182 is varied from 10 mm, 15 mm or 30 mm away from the chuck, the heat transfer rate to the workpiece 118 can be controlled, accordingly.

In some situations, a so-called "hot spot" can be present on the heated chuck 130, where a hot spot location 188, such as in the middle of the heated chuck, can be hotter (e.g., by 30 degrees) than the remainder of the heated chuck. If the workpiece 118 is placed directly on the surface 184 of the heated chuck 130 with such a hot spot during heating of the workpiece, the heat associated with the hot spot is transferred directly to the workpiece, and the associated temperature difference can cause deleterious thermal stresses. However, in accordance with the present disclosure, if the workpiece is held the predetermined distance 182 away from the heated chuck 130 having such a hot spot location 188, the heat from the hot spot is advantageously diffused. While the workpiece 118 will not be heated as much at the predetermined distance 182 than it would should it reside directly on the surface 184 due to the view factor, increasing the view factor by bringing the workpiece closer to the heated chuck can bring the temperature of the workpiece to a higher preheat temperature.

In one example, the predetermined distance 182 can be varied, whereby the workpiece 118 can be positioned at a plurality of predetermined distances from the heated chuck 130 to further control the heating of the workpiece. For example, the workpiece 118 can be initially positioned predetermined distance 182 (e.g., approximately 30 mm) from the surface 184 of the heated chuck 130, whereby the predetermined distance can be slowly decreased (e.g., to approximately 2-3 mm), thus minimizing thermal shock. Such a positioning of the workpiece 118 is advantageous over placing the workpiece 118 from a relatively low temperature (e.g., room temperature) directly onto a 700 C surface of the heated chuck 130.

Accordingly, it will be understood that the present disclosure advantageously mitigates hot spots associated with the heated chuck 130, aids with thermal uniformity across the workpiece 118 (e.g., by reducing non-uniformities via the variation in view factor), and aids with clamping stresses previously experienced due to thermal growth. Hot spot locations (e.g., 30 degree differences) may be further advantageously diffused and mitigated via the conductance of the workpiece 118.

The workpiece 118, for example, can be held by the end effector 180 via the workpiece transfer apparatus 178B e.g., a robot) of FIG. 1. The end effector 180 may comprise a tray or other style of passive gripping mechanism where the workpiece 118 rests on the end effector by gravity, as illustrated in FIG. 2. For example, the workpiece 118 may rest on three or more pins 190 associated with the end effector. In the present example, there is no axial gripper on the end effector 180, whereby the workpiece 118 is permitted to freely expand both radially and axially. For example, having only one degree of constraint by the end effector 180 (e.g., gravity forcing contact between the workpiece 118 and the pins 190), and the remaining two degrees of freedom of movement of the workpiece allow the workpiece to expand without deleterious results.

In the present example, the heated chuck 130 is positioned vertically below the workpiece 118, whereby the workpiece is held under its outside perimeter by the end effector 180, whereby an overlap 192 is provided between the workpiece and the heated chuck 130. Upon heating, for example, the workpiece 118 is advantageously permitted to radially (and axially) expand.

Thus, in accordance with the present disclosure, the end effector 180 is configured to maneuver and place the workpiece 118 at the predetermined distance 182 from the surface 184 of the heated chuck 130 for selective heating of the workpiece. The predetermined distance 182, for example, can be varied according to the desired radiative emission to be received at the workpiece 118 from the heated chuck 130. In one example, after a predetermined temperature rise and/or a predetermined amount of time has elapsed, the workpiece 118 can be placed directly on the surface 184 of the heated chuck 130, and selectively clamped thereto. The preheat apparatus 152 of FIG. 1, for example, may be optionally utilized. For example, the preheat apparatus 152 may be utilized to preheat the workpiece a predetermined amount prior to being placed the predetermined distance 182 from the heated chuck 130. Alternatively, the preheat apparatus 152 may be eliminated or otherwise not utilized to heat the workpiece 118 prior to the selective placement at the predetermined distance 182 from the surface 184 of the heated chuck 130 shown in FIG. 2

The placement of the workpiece 118 at the predetermined distance 182 from the heated chuck 130, for example, can be further considered as a "soak", whereby the workpiece is allowed to soak for a time above the heated chuck. Such a soak can be utilized to establish a uniform temperature of the workpiece 118 prior to processing, thereof.

The present disclosure further contemplates a similar placement of the workpiece 118 at the predetermined distance 182 from the heated chuck 130 when the workpiece is removed from the surface 184 of the heated chuck (e.g., after an implantation of ions, therein). As such, thermal non-uniformities may be further mitigated during a cool-down of the workpiece 118, but in a reverse manner as that described above.

In another example, variations of the predetermined distance 182 and/or time spent at the predetermined distances are contemplated. For example, instead of distinct predetermined distances being utilized (e.g., 10 mm and 30 mm), a rate of movement (e.g., generally continuous movement) of the workpiece 118 toward or away from the heated chuck 130 is contemplated, such as 1 mm every 5 seconds, or any other rate suitable for a desired heat transfer and workpiece throughput. As such, any combination of variation of the predetermined distance 182 over time is contemplated, as well as a continuum of speed or a variable speed, where the determination of speed, time, and/or rate may be characterized for each workpiece 118 and/or material constituency of the workpiece. It is further noted that the controller 170 of FIG. 1, for example, is appropriately configured to provide such placement and/or movement of the workpiece 118 with respect to the heated chuck 130.

Thus, the present disclosure advantageously minimizes a stress on the workpiece 118 previously associated with a thermal growth of the workpiece when clamped and heated on a heated chuck (e.g., ESC or other clamping plate). The present disclosure thus allows the workpiece 118 to thermally expand prior to clamping to the heated chuck 130 for subsequent processing, thereof. The present disclosure further reduces a temperature ramp rate, which could otherwise cause thermal non-uniformities and thermal stresses or breaks in the workpiece 118, as described above. Still further, the present disclosure advantageously controls the view factor to reduce "hot spots" and better distribute energy uniformly across the workpiece 118 during heating, thereof.

In accordance with another aspect of the disclosure the heated chuck 130 can be utilized as a preheat station positioned inside or proximate to the process chamber 122, instead of, or in addition to, having an independent preheat apparatus 152 located in a load lock chamber 138A, or elsewhere in the system 101. For example, multiple heated chucks 130 may be implemented within the process chamber 122 of FIG. 1, whereby heating of one or more workpieces 118 may be accomplished without the deleterious effects discussed above. As such, costs associated with the system can be advantageously reduced.

The present disclosure is further advantageous over preheating that may have been conventionally performed solely via the independent preheat apparatus 152 located in the load lock chamber 138A, in that variables such as time and temperature are limited when conventional preheat is performed in atmosphere. By utilizing the heated chuck 130 in the vacuum environment 126 as a source for preheating the workpiece 118 prior to high temperature processing, additional control of the heating of the workpiece is advantageously provided by the predetermined distance 182 of FIG. 2.

Further, the present disclosure also contemplates preheating of the workpiece 118 in the load lock chamber 138A for increased throughput, while the preheating of workpiece at the heated chuck 130 disclosed herein advantageously increases uniformity and mitigates thermal shock to the workpiece. As such, significant additional benefits may be realized in processing various compositions of the workpieces 118, such as a workpiece comprising or comprised of silicon carbide.

Figure 3:
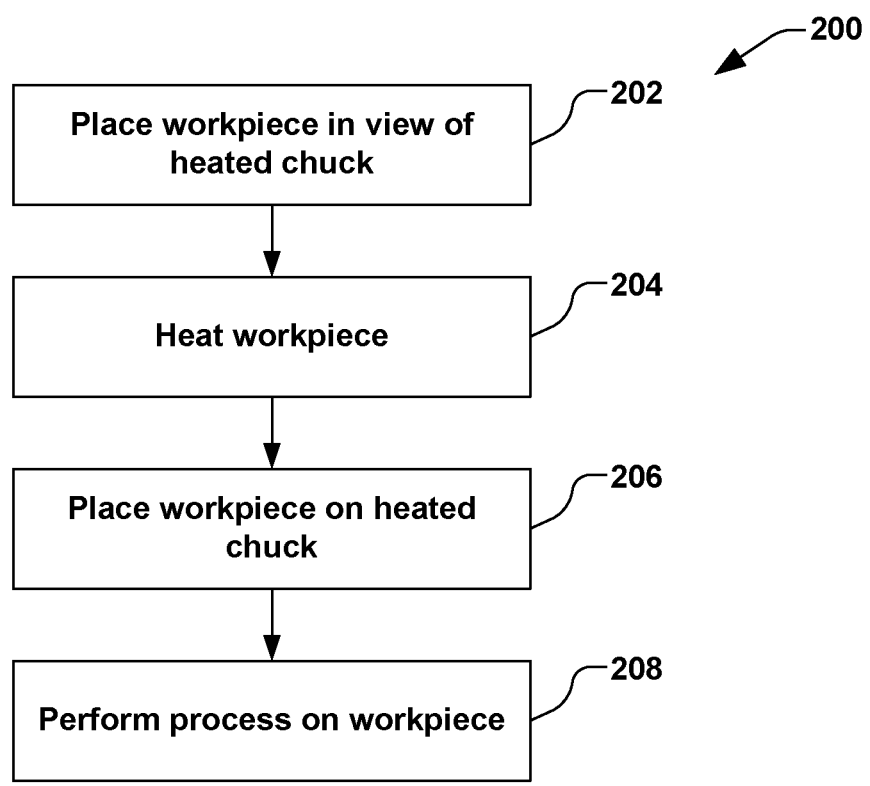
FIG. 3 is a block diagram illustrating an exemplary method for heated ion implantation of workpieces according to another exemplary aspect of the disclosure.

The present disclosure further provides a method 200 in FIG. 3 for heating a workpiece and providing substantially uniform thermal characteristics across the workpiece. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

As illustrated in FIG. 3, the method 200 begins at act 202, wherein the workpiece is placed in view of a heat source in a vacuum at a configurable predetermined distance and for a configurable amount of time. The view factor and time at which the workpiece resides at the predetermined distance relates (e.g., directly relates) to an amount of thermal energy that the workpiece can absorb, thus resulting in a temperature increase at the workpiece in act 204. The rate at which the temperature increases, for example, will vary based on the predetermined distance between the heat source and the workpiece, and the time at the predetermined distance.

The workpiece, for example, is permitted to reach a predetermined temperature before being placed directly on the chucking surface in act 206, thus permitting a portion of the thermal expansion to occur in an unconstrained state. Such heating in act 204 and placement in act 206 also allows for additional time for the workpiece to conduct heat within itself, thus allowing for better thermal uniformity and lower thermal stresses caused by potential hot spots on the heated chuck.

In act 208, a processing is performed on the workpiece, such as an ion implantation at an elevated temperature.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A workpiece processing system, comprising:
   a vacuum chamber;
   a first chamber operably coupled to the vacuum chamber;
   a heated chuck positioned within the vacuum chamber, wherein the heated chuck is configured to selectively clamp a workpiece to a clamping surface thereof, and wherein the heated chuck is configured to selectively heat the clamping surface;
   a workpiece transfer apparatus having an end effector configured to selectively support the workpiece, wherein the workpiece rests on the end effector, and wherein the workpiece transfer apparatus is configured to selectively transfer the workpiece between the heated chuck and the first chamber; and
   a controller configured to selectively position the workpiece with respect to the heated chuck via a control of the workpiece transfer apparatus, wherein the controller is configured to position the workpiece at a predetermined distance from the clamping surface, wherein the predetermined distance generally determines an amount of radiation received by the workpiece from the heated chuck, and wherein the controller is further configured to selectively place the workpiece on the surface of the heated chuck via a control of the workpiece transfer apparatus.

2. The workpiece processing system of claim 1, wherein the controller is further configured to control an amount of time during which the workpiece is positioned at the predetermined distance.

3. The workpiece processing system of claim 2, wherein the controller is configured to selectively vary one or more of the predetermined distance and amount of time based on one or more of a desired temperature profile of the workpiece and a predetermined temperature profile of the heated chuck.

4. The workpiece processing system of claim 1, further comprising an ion implantation system configured to direct an ion beam toward the workpiece.

5. The workpiece processing system of claim 1, wherein the heated chuck comprises one or more radiative heaters embedded within the heated chuck.

6. The workpiece processing system of claim 1, wherein the heated chuck is further configured to heat the workpiece to a predetermined processing temperature.

7. The workpiece processing system of claim 6, wherein the predetermined processing temperature ranges from approximately 100° C. to approximately 1200° C.

\* \* \* \* \*